United States Patent [19]

Kudou

[11] Patent Number: 5,373,480

[45] Date of Patent: Dec. 13, 1994

[54] READ ONLY MEMORY

[75] Inventor: Tsuneaki Kudou, Kanagawa, Japan

[73] Assignee: Kabushiki Kaisha Toshiba, Kanagawa, Japan

[21] Appl. No.: 182,553

[22] Filed: Jan. 18, 1994

[30] Foreign Application Priority Data

Jan. 19, 1993 [JP] Japan .................. 5-006793

[51] Int. Cl.$^5$ .................................... G11C 13/00
[52] U.S. Cl. .................. 365/230.08; 365/189.05; 365/230.01; 365/230.03
[58] Field of Search .............. 365/104, 189.01, 189.05, 365/230.01, 230.03, 230.08

[56] References Cited

U.S. PATENT DOCUMENTS 5,305,282 4/1994 Choi .................. 365/230.08

Primary Examiner—Terrell W. Fears
Attorney, Agent, or Firm—Finnegan, Henderson, Farabow, Garrett & Dunner

[57] ABSTRACT

A read only memory includes a memory cell matrix, a word line decoder, a column decoder, and an output buffer. Said memory cell matrix is comprised of a plurality of submatrices, each of which is formed by dividing bit lines into a plurality of parts. Each sub-matrix contains the same word lines. Said word line decoder produces a signal to select a certain sub-matrix in addition to signals to select a certain word line. Said column decoder produces signals to select one column from each of said sub-matrix. Said output buffer has a column selection circuit having a plurality of stages. The first stage selects one column from each of said sub-matrices according to said signals from said column decoder. The second stage selects one column among said selected columns according to said signal to select a certain sub-matrix produced in said word line decoder. Thus, a particular memory cell is selected from the memory cell matrix. In this case, the number of memory cell transistors connected to each bit line is greatly reduced. The data readout speed of this ROM is, therefore, greatly improved in this invention.

6 Claims, 9 Drawing Sheets

READ ONLY MEMORY

BACKGROUND OF THE INVENTION

1. Field of the invention

This invention relates to a read only memory, and more particularly to a read only memory for use in a semiconductor integrated circuit device which requires high speed operation.

2. Description of the prior art

As the operating speed of a microprocessor has made great progress in recent years, high speed operation is strongly required in a read only memory (referred to as ROM, below) which stores system programs and processing programs of the microprocessor. In other words, the reduction of access time which is from an address input to a data readout is highly required in the ROM.

FIG. 1 shows the structure of a ROM according to a prior art of this invention. As shown, this ROM is comprised of a memory cell matrix 101, a word line decoder 102, a column decoder 103, and an output buffer 104. In memory cell matrix 101, a plurality of word lines and bit lines are arranged in form of a matrix and a memory cell is placed at each intersecting point of the matrix. Word line decoder 102 decodes an address input having a plurality of bits so as to select a certain word line. According to said address input, column decoder 103 generates a column control signal and selects a certain bit line. And, output buffer 104 outputs stored data in a memory cell whose position is designated by a word line and a bit line selected with said word and column decoders.

FIG. 2 shows the detailed structure of memory cell matrix 101 and output buffer 104 of the prior art ROM (NOR type; n bits×32 words) which is of a precharge type. In this figure, the circuit structure of one bit is shown.

In FIG. 2, B0, . . . , and B3 indicate bit lines, and W0, . . . , and W7 indicate word lines. At each intersecting point of these bit and word lines, a memory cell comprised of an N-channel transistor is placed. Each one end of bit lines B0, . . . , and B3 is connected to a power supply VDD through N-channel transistor 111, . . . , or 114, each of which turns on or off by being controlled with a clock signal CLK. Each other end of bit lines B0, . . . , and B3 is connected to data line 119 through N-channel transistor 115, . . . , or 118, each of which is to select a column line and turns on or off according to column control signals C3, . . . , and C0. Data line 119 is connected to power supply VDD through P-channel transistor 120 which turns on or off by being controlled with the inverted clock signal −CLK. This data line 119 is also connected to the input of sense inverter 121 which produces output data OUT.

FIG. 3 shows the circuit structure of word line decoder 102 of the prior art ROM.

As shown in FIG. 3, word line decoder 102 is comprised of four inverters, eight 3-input NAND gates, and eight 2-input NOR gates.

The structure of column decoder 103 is almost the same as that of the present invention. For instance, a column decoder which is shown in FIG. 6 explained later may be used as column decoder 103.

The operation of the above mentioned ROM will be described below.

Once N-channel transistors 111, . . . , and 114 have turned on in synchronous with the rising of clock CLK, all the bit lines B0, . . . , and B3 are precharged. After the rising of clock CLK, the values of address inputs A0, . . . , and A4 are fixed. On the other hand, during level H of clock CLK, the inverted signal −CLK stays at level L. This allows P-channel transistor 120 to turn on and data line 119 to be precharged up to level VDD.

Let us consider one example in which word line W2 is selected by word line decoder 102 so as to select memory cell Z1. As shown in FIG. 2, there is no transistor connected to memory cell Z1. Then, bit line B2 is not discharged and transistor 117 is selected. As a result, sense inverter 121 gives "0" as output data OUT. On the contrary, if a transistor is connected to memory cell A1, bit line B2 is discharged, allowing sense inverter 121 to give "1" as an output.

As is obvious from the above mentioned explanation, in such the precharge ROM, the precharged value is output without any change when "0" is generated as output data. In this case, no substantial time delay is produced. In other words, signal delay arises only when a transistor connected to a memory cell turns on to discharge the bit line connected to the memory cell. In this case, the output from sense inverter 121 changes from "1" to "0".

According to the above mentioned reason, the logical threshold of sense inverter 121 is usually set at a relatively high value in said ROM, in which high speed operation is required, in order to quickly detect the output change from "1" to "0".

In the above mentioned ROM, however, one serious problem still exists.

Each transistor in the memory cell matrix connected to respective bit line B0, . . . , or B3, has a junction capacitance across its gate and the respective bit line. On a data readout, however, only one transistor is selected to discharge among other transistors connected to the same bit line. Accordingly, the Junction capacitance of the other transistors connected to the same bit line becomes considerably large at the data readout. This fact lowers the data readout speed.

The above mentioned disadvantage becomes more serious when a large number of transistors are used so as to increase the storage capacity of the ROM. As a result, a large capacity ROM having a capability of high speed data readout can hardly be realized in the prior art techniques.

SUMMARY OF THE INVENTION

This invention has been made to overcome the above mentioned problem of the prior art ROM.

Therefore, the objective of the present invention is to provide a large capacity ROM having a capability of high speed data readout.

In order to accomplish the above mentioned objective, the read only memory of this invention has a memory cell matrix which includes a plurality of submatrices, each of which is formed by dividing bit lines into, for example, two parts. In both submatrices, word lines are used in common. Thus, the number of memory cell transistors contained in each bit line is greatly reduced in this invention. In addition, the read only memory of this invention has a word line decoder, column decoder, and an output buffer. Said word line decoder produces a signal to select a certain submatrix in addition to word line selection signals. Said output buffer contains a column selection circuit having a plurality of stages. In this circuit, the first stage selects one column from each of said submatrices according to signals obtained from said column decoder. On the other hand, the second stage or the following selects one column among said columns selected in said first stage according to said signal to select a certain submatrix produced in said word line decoder. Thus, a particular memory cell is selected and the data are readout from the ROM.

In the ROM of this invention, as mentioned above, the number of memory cell transistors contained in each bit line is greatly reduced. This also reduces the magnitude of junction capacitance developed across a bit line and the transistors connected to this bit line. As a result, the data readout speed from the ROM is greatly improved in this invention as compared with the prior art ROM. So this invention can provide a read only memory having a large capacity without deteriorating the data readout speed.

In said structure, the second stage or the following in said column selection circuit may be structured with a clocked sense inverter so as to reduce the number of pass transistors. According to this structure, the data readout speed is still improved.

These and other objectives, features, and advantages of the present invention will be more apparent from the following detailed description of preferred embodiments in conjunction with the accompanying drawings.

DETAILED DESCRIPTION OF PREFERRED EMBODIMENTS

Figure 1:
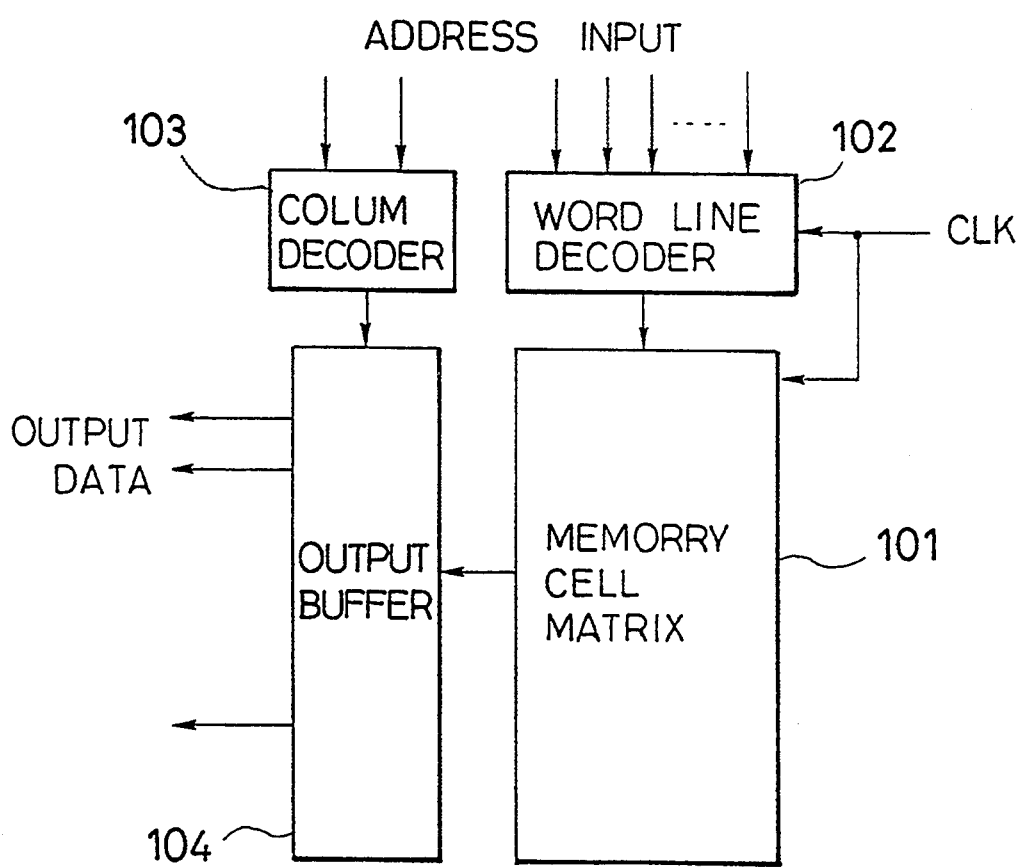
FIG. 1 is a block diagram showing the general structure of a read only memory (ROM)
Figure 4:
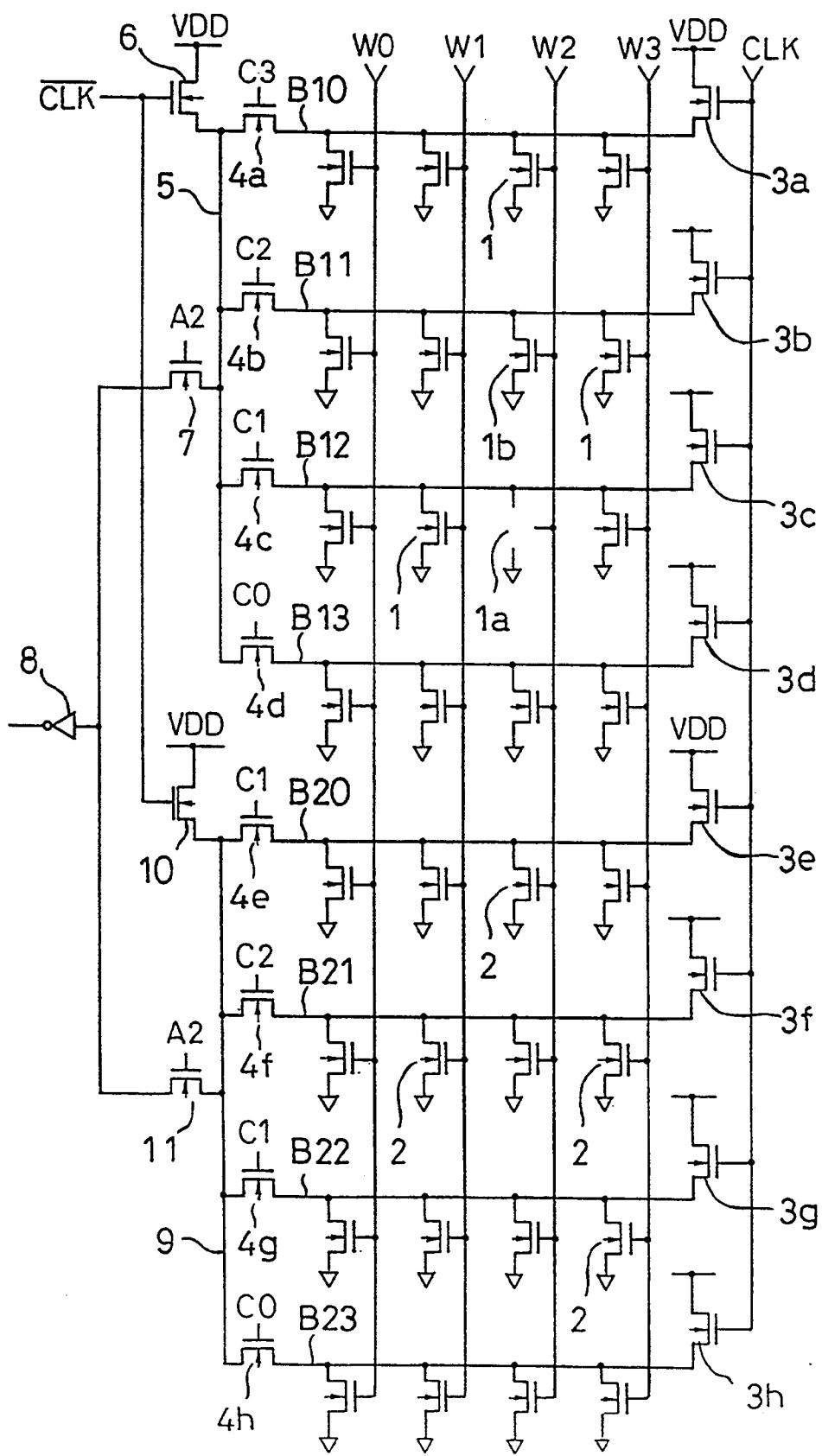
FIG. 4 is a circuit diagram showing the one bit structure of a memory cell matrix and an output buffer of a precharge type ROM according to the first embodiment of this invention.
Figure 5:
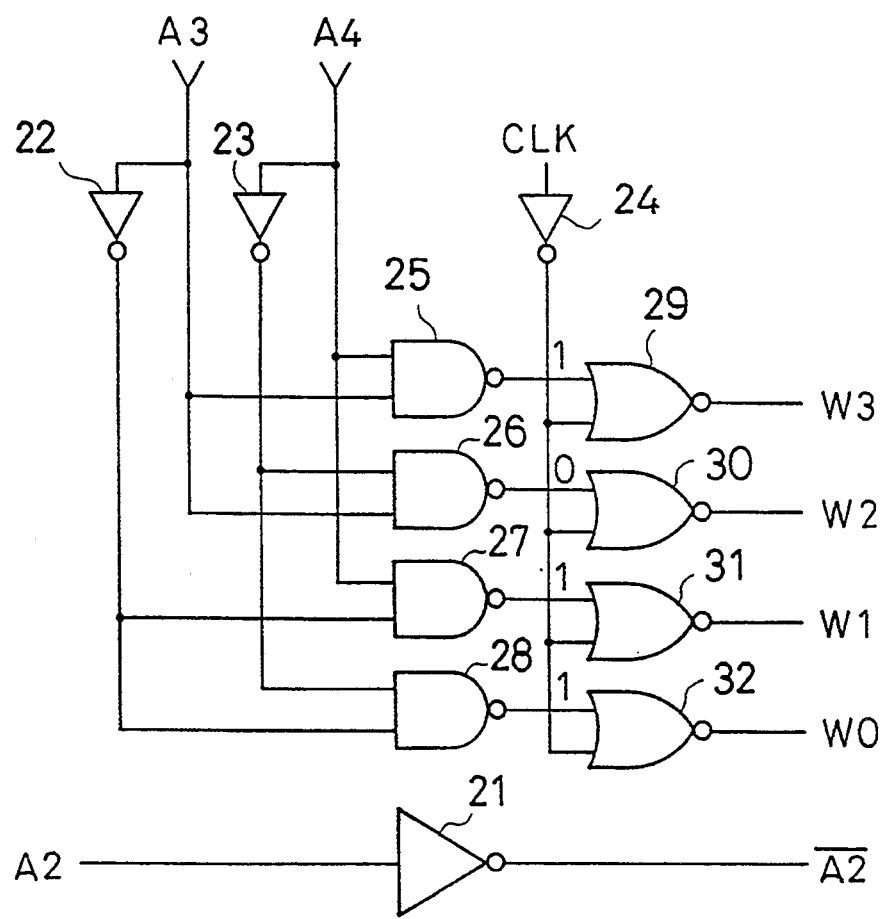
FIG. 5 is a circuit diagram showing the structure of a word line decoder of the precharge ROM according to the first embodiment of this invention.
Figure 6:
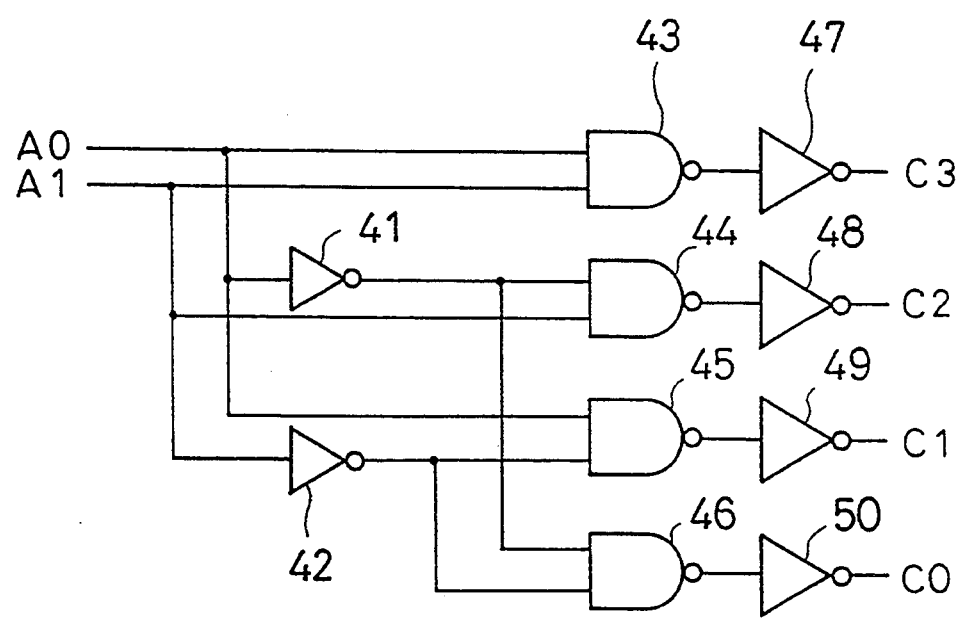
FIG. 6 is a circuit diagram showing the structure of a column decoder of the precharge ROM according to the first embodiment of this invention.

The general structure of the ROM according to the first embodiment of this invention is shown in FIG. 1 which have been explained before. The detained structure of the ROM according to the first embodiment of this invention is shown in FIGS. 4, 5, and 6. In particular, FIG. 4 shows the one bit structure of memory cell matrix 101 and output buffer 104, FIG. 5 shows the circuit structure of word line decoder 102, and FIG. 6 shows the circuit structure of column decoder 103 of the first embodiment.

The first embodiment of this invention differs from the prior art ROM in that a plurality of bit lines are divided into two parts so as to provide two sub-matrices of memory cells. According to this structure, the selection of a column line is carried out in two stages. However, the number of transistors connected to each bit line is reduced to half. This also reduces the magnitude of load on each bit line to half, thus permitting a high speed data readout.

As shown in FIG. 4, memory cell matrix 101 of the ROM according to the first embodiment is comprised of a upper sub-matrix and a lower sub-matrix. The upper sub-matrix includes bit lines B10, B11, B12, and B13, and the lower matrix includes bit lines B20, B21, B22, and B23. In the upper and the lower sub-matrices, word lines W0, W1, W2, and W3 are used in common. In addition, N-channel transistor 1 is placed at each intersecting point of bit lines B10, . . . , and B13 and word lines W0, . . . , and W3 in the upper sub-matrix, and N-channel transistor 2 is placed at each intersecting point of bit lines B20, . . . , and B23 and word lines W0, . . . , and W3 in the lower sub-matrix.

In the upper sub-matrix, the gate of N-channel transistor 1 is connected to the corresponding word line W0, W1, W2, or W3, and its drain is connected to the corresponding upper bit line B10, B11, B12, or B13. In the lower sub-matrix, the gate of N-channel transistor 2 is connected to the corresponding word line W0, W1, W2, or W3, and its drain is connected to the corresponding lower bit line B20, B21, B22, or B23. On the other hand, the sources of N-channel transistors 1 and 2 are all grounded.

Figure 2:
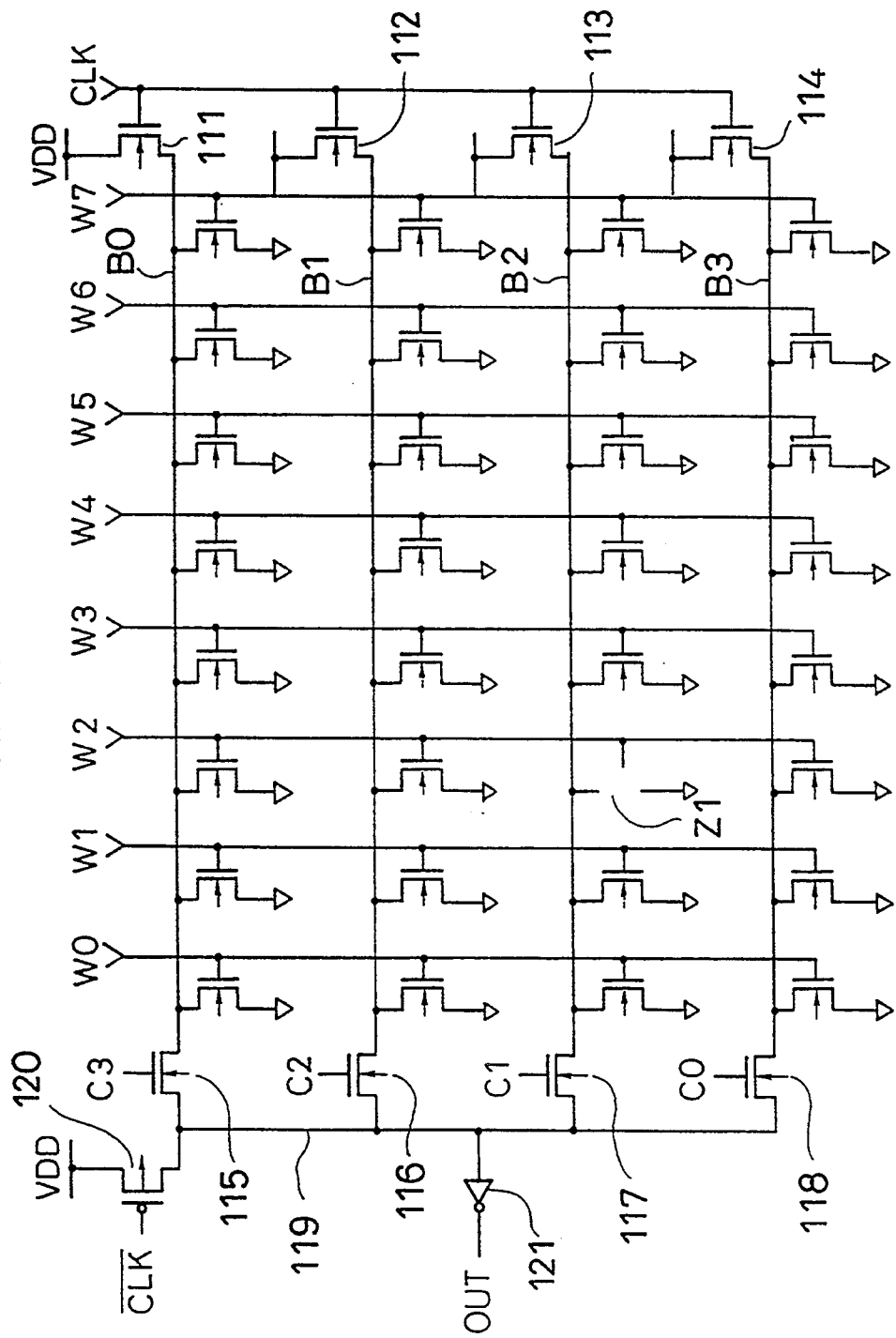
FIG. 2 is a circuit diagram showing the one bit structure of a memory cell matrix and an output buffer used in the ROM according to a prior art of this invention.
Figure 3:
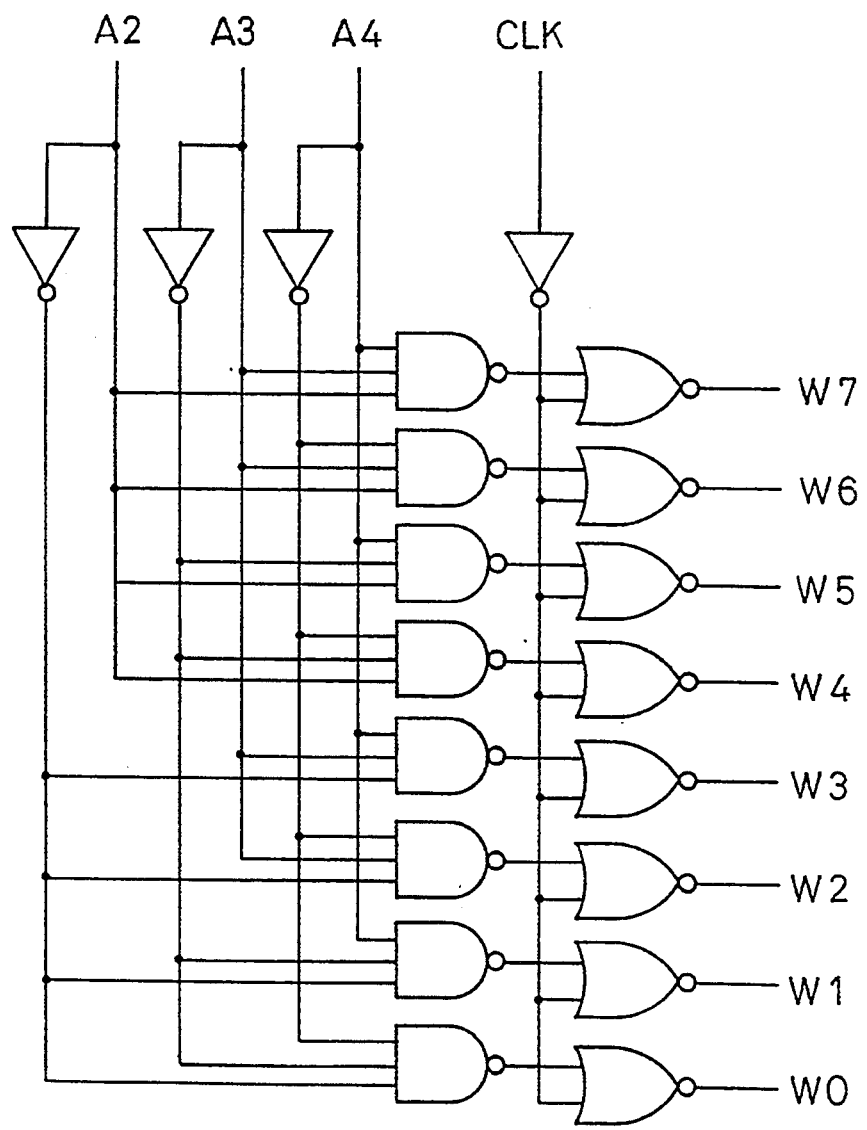
FIG. 3 is a circuit diagram showing the structure of a word line decoder used in the ROM according to the prior art.

Because of the above mentioned structure, the number of transistors 1 or 2 connected to one bit line is reduced by half (that is, four) as compared with that of the prior art ROM shown in FIG. 2.

In such the memory cell matrix, "1" or "0" is stored in advance in each memory cell comprised of N-channel transistor 1 or 2. The data pattern of this matrix is determined by the mask pattern which is used in a fabricating process of the ROM of this embodiment. In actuality, the existence of N-channel transistors 1 or 2 depends on the thickness of an oxide film in their gate areas. In FIG. 4, the place labeled 1a has no N-channel transistor 1. For example, data "1" are stored in the memory cell which has an N-channel transistor, while data "0" are stored in the memory cell which has no N-channel transistor. The storage content of the ROM is determined in such a way.

Each source of N-channel transistors 3a, . . . , and 3d and 3e, . . . , and 3h is connected to each one end of upper and lower bit lines B10, B11, B12, B13, B20, B21, B22, and B23. In addition, each drain of said N-channel transistors is connected to power supply VDD and each gate is connected to the signal line for supplying clock signals. N-channel transistors 3a, . . . , and 3d and 3e, . . . , and 3h come into an on condition at the rising of clock signal CLK, thus precharging bit lines B10, . . . , and B28.

In addition, each another end of upper bit lines B10, B11, B12, and B13 is connected to data line 5 through N-channel transistors 4a, 4b, 4c, and 4d, each of which turns on or off by being controlled with column control signal C3, C2, C1, or C0. Column control signals C3, . . . , and C0 are generated in a column decoder described later. Another end of data line 5 is connected to the drain of P-channel transistor 6 whose source is connected to the power supply VDD and whose gate is connected to the signal line for supplying inverted clock signal −CLK. P-channel transistor 6 turns on at the rising of clock signal CLK, thus precharging data line 5 up to voltage VDD.

Data line 5 is connected to the input of sense inverter 8 through N-channel transistor 7. The on-off control of transistor 7 is carried out by the inverted signal (−A2, column selection signal) of address A2, which is the second bit among the address inputs A0, . . . , and A4 supplied to this ROM. This inverted signal −A2 is produced in a word line decoder described later.

In the similar manner, each one end of lower bit lines B20, B21, B22, and B23 is connected to data line 9 through N-channel transistor 4e, 4f, 4g, or 4h, each of which turns on or off by being controlled with column control signal C3, C2, C1, or C0. P-channel transistor 10, which has the same function as that of P-channel transistor 6, is connected to another end of data line 9. In addition, data line 9 is connected to the input of sense inverter 8 through N-channel transistor 11 which turns on or off by being controlled with the signal of address A2 (column selection signal). In this case, N-channel transistors 4a, . . . , and 4h and N-channel transistors 7 and 11 make up a column selection circuit which is included in output buffer 104. In particular, transistors 4a, . . . , and 4h make up the first stage of the column selection circuit, while transistors 7 and 11 make up the second stage of the column selection circuit.

On the other hand, as shown in FIG. 5, the word line decoder of this embodiment has inverters 21 for generating said inverted signal −A2 of address A2. This decoder also has inverters 22, 23, and 24, 2-input NAND gates 25, 26, 27, and 28, and 2-input NOR gates 29, 30, 31, and 32. These are for use to select word lines, each of which corresponds to address A3 in the third bit or address A4 in the highest bit, among word lines W0, . . . , and W3.

In fact, address A3 and A4 are input to NAND gate 25, the inverted signal of address A4 by inverter 23 and address A3 are input to NAND gate 26, the inverted signal of address A3 by inverter 22 and address A4 are input to NAND gate 27, and the inverted signals of address A3 and A4 by inverters 22 and 23 are input to NAND gate 28. In addition, each output of NAND gates 25 to 28 is connected to the respective one input of NOR gates 29, 30, 31, and 32. Each another input of NOR gates 29, . . . , and 32 is connected to the output of inverter 24 which is for the inversion of clock signal CLK. Still in addition, each output of NOR gates 29, . . . , and 32 is connected to word line W3, W2, W2, or W0 shown in FIG. 4.

As shown in FIG. 6, the column decoder of this embodiment has inverters 41 and 42 provided at the input side, 2-input NAND gates 43, 44, 45, and 46, and inverters 47, 48, 49, and 50 provided at the output side. This decoder selects one of column control signals C3, C2, C1, and C0, the selected signal which corresponds to address A0 (the lowest bit) or address A1 (the first bit).

In this decoder, addresses A0 and A1 are input to NAND gate 43, the inverted signal of address A0 through inverter 41 and address A1 are input to NAND gate 44, the inverted signal of address A1 through inverter 42 and address A0 are input to NAND gate 45, and the inverted signals of addresses A0 and A1 through inverters 41 and 42 are input to NAND gate 46, respectively. Column control signals C0, . . . , and C3 are respectively output from NAND gates 43, and 46 through inverters 47, . . . , and 50.

Figure 7:
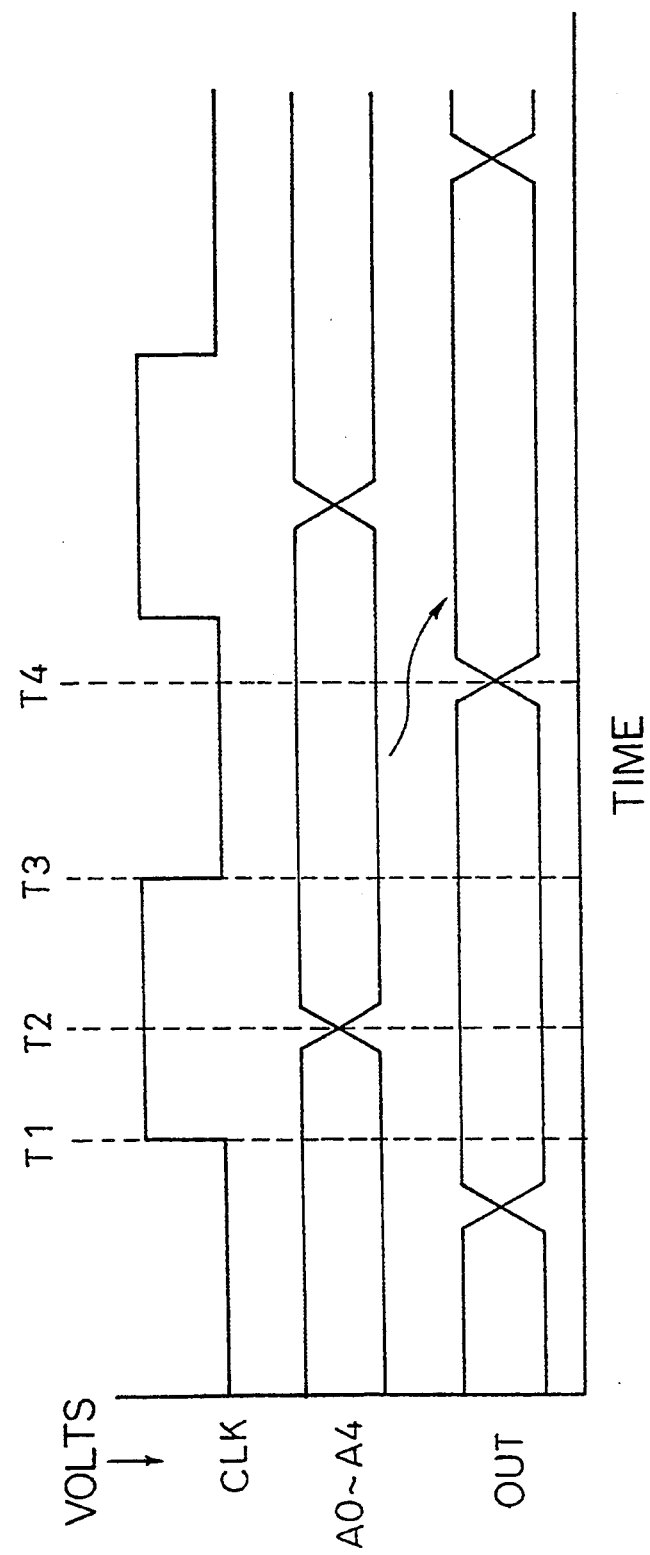
FIG. 7 is a time chart for explaining the operation of the precharge ROM of the first embodiment.

Next, the readout operation of the above mentioned ROM will be explained below with referring to the time chart shown in FIG. 7. In this case, "0, 1, 0, 1, 0" are supplied as address inputs A0, A1, A2, and A3 to the ROM of this embodiment.

Once N-channel transistors 3a, . . . , and 3h have turned on in synchronous with the rising of clock CLK at Time T1, all the bit lines B10, . . . , and B13, and B20, . . . , and B23 are precharged by the value VDD−Vth (Vth shows the threshold voltage of N-channel transistors). During level H of clock CLK, the inverted signal −CLK of clock signal CLK stays level L. Then, P-channel transistors 6 and 10 turn on so as to precharge data lines 5 and 9 up to voltage VDD. At time T2 (after the rising of clock CLK), address inputs A0, . . . , and A4 are fixed to be, for example, "0, 1, 0, 1, 0" so as to indicate which cell should be readout. In this example, memory cell 1b shown in FIG. 4 is designated to readout.

On the other hand, address A2 ("0") in the second bit, address A3 ("1") in the third bit, and address A4 ("0") in the highest bit are provided to word line decoder 102. In actuality, 0 and 1 are input to NAND gate 25, 1 and 1 are input to NAND gate 26, 0 and 0 are input to NAND gate 27, and 1 and 0 are input to NAND gate 28 in word line decoder 102. As a result, only the output from NAND gate 26 comes into 0 while the other outputs come into 1. These output signals are, then, provided to NOR gates 29, 30, 31, and 32.

In the above mentioned condition, if clock CLK stays at level H, NOR gates 29, . . . , and 32 only output signals of level L no matter what the output levels of NAND gates 25, . . . , and 28 are. In this case, all the word lines W0, . . . , and W3 are at level L. As a result, the data readout can't be carried out. On the contrary, once clock CLK has come into level L (at time T3), only the output from NOR gate 30 comes into level H (word line selection signal), permitting word line W2 to become level H. Thus, word line W2 is selected.

Once word line W2 has been selected as mentioned above, all the N-channel transistors 1 and 2 connected to word line W2, including N-channel transistor 1 in memory cell 1b shown in FIG. 4, turn on so as to discharge upper and lower bit lines B10, B11, B13, and B20, B21, B22, and B23 through N-channel transistors 1 and 2.

On the other hand, address A0 ("0") of the lowest bit and address A1 ("1") of the first bit are supplied to column decoder 103. In other words, 0 and 1 are input to NAND gate 43, 1 and 1 are input to NAND gate 44, 0 and 0 are input to NAND gate 45, and 1 and 0 are input to NAND gate 46 shown in FIG. 6. According to these inputs, column control signals C0, C1, C2, and C3 come into 0, 1, 0, and 0 respectively. This means column control signal C2 is selected and only N-channel transistors 4b and 4f in the output buffer turn on. Thus, the first selection of column is carried out. In this selection, voltage "0" an upper bit line B11 and lower bit line B21 is delivered on data lines 5 and 9.

In the word line decoder shown in FIG. 5, address A2 of "0" is inverted by inverter 21 so as to output "1" as column selection signal −A2 which is then input to the gate of N-channel transistor 7. On the other hand, address A2 (column selection signal) is input to the gate of N-channel transistor 11. Then, N-channel transistor 7 turns on because address A2 is "0", while N-channel transistor 11 keeps an off condition. Thus, the second selection of column is carried out. According to the first and second selection, voltage "0" at upper bit line B11 is selected and supplied to the input of sense inverter 8. When this input voltage of sense inverter 8 becomes lower than its threshold voltage at time T4, "1" is output from sense inverter 8.

In this embodiment, the number of N-channel transistors connected to one bit line is reduced to half, that is, four, as compared with that of the prior art. The junction capacitance developed across designated bit line B11 and N-channel transistors 1 is, therefore, reduced to half. As a result, the electric charges accumulated on bit line B11 can be quickly discharged. This allows the high speed readout of data "1" from the output of sense inverter 8. In the similar manner, the data readout from other memory cells can also be carried out in a high speed.

As explained above, this embodiment can greatly reduce the delay time which originates from the ROM's readout. In other words, this embodiment can greatly reduce the time required to readout data "1" from the ROM, that is, the time from the turn on of N channel transistor 1 or 2 to the discharge of a bit line in which electric charges have been accumulated. This advantage is remarkable when many transistors are connected to each bit line.

Figure 8:
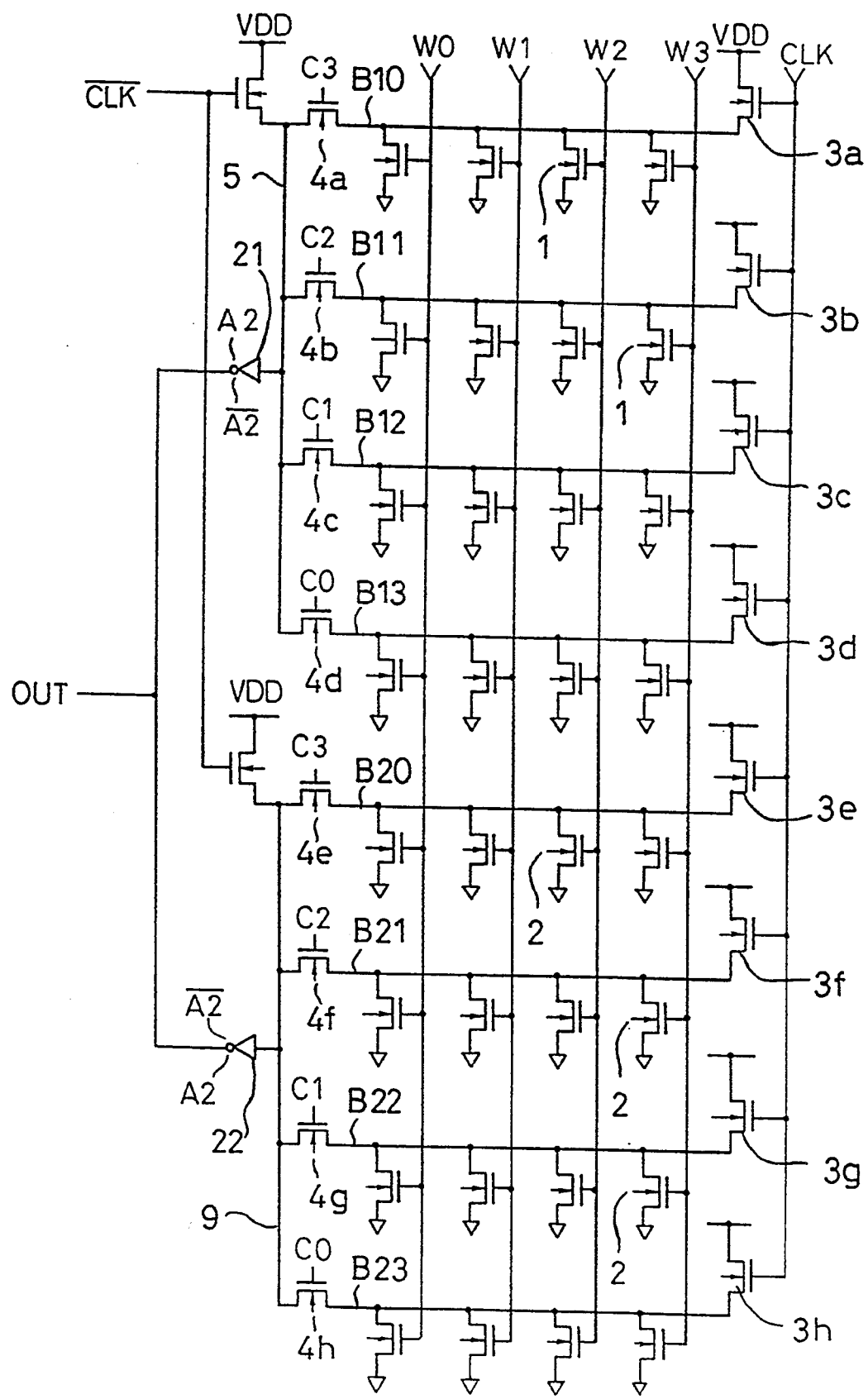
FIG. 8 is a circuit diagram showing the one bit structure of a memory cell matrix and an output buffer of a precharge ROM according to the second embodiment of this invention.

FIG. 8 shows the one-bit circuit of the memory cell matrix and the output buffer contained in a precharge ROM (NOR type; n bits×32 words) according to the second embodiment of this invention. In this figure, the same numbers as those shown in FIG. 4 indicate the same or similar structure elements.

The precharge ROM of this embodiment differs from the ROM of the first embodiment in that the circuit to carry out the second selection of column is comprised of clocked sense inverters 21 and 22 instead of N channel transistors 7 and 11 so as to remove sense inverter 8. This structure reduces one stage of pass-transistors. Due to this reduction of transistors, the data readout From the ROM can be carried out more quickly.

Figure 9:
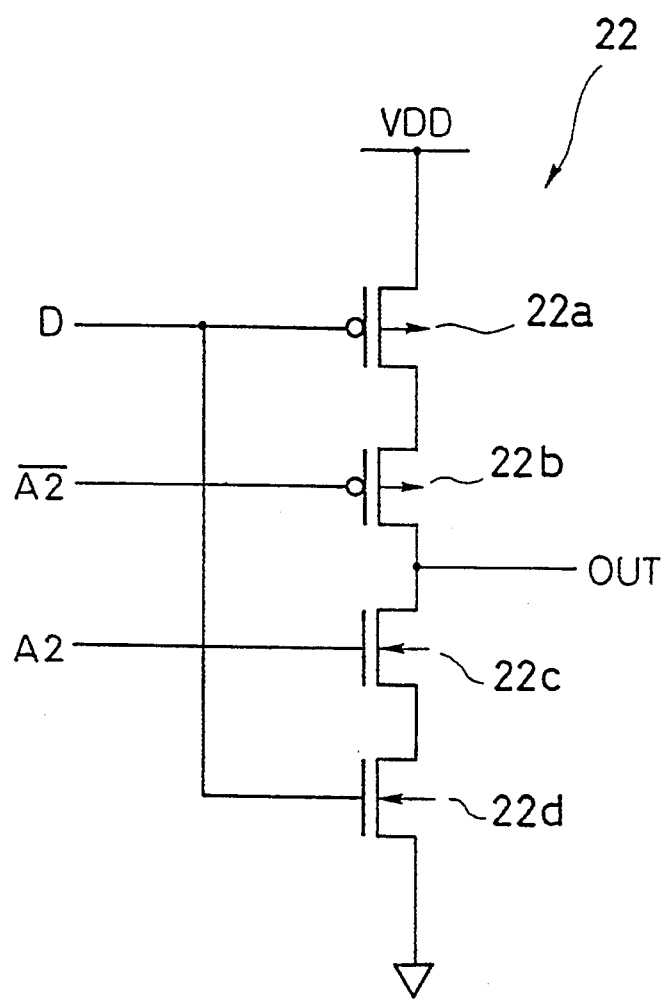
FIG. 9 is a circuit diagram showing the structure of a clocked sense inverter contained in said precharge ROM according to the second embodiment.

As shown in FIG. 9, clocked sense inverter 22 is for example, comprised of P channel transistors 22a and 22b, and N channel transistors 22c and 22d. Data D is input to the gates of P channel transistor 22a and N channel transistor 22d. And, address A2 and its inverted signal −A2 are input to the gates of N channel transistor 22c and P channel transistor 22b respectively. These signals D, A2, and −A2 are the control signals of clocked sense inverter 22. Clocked sense inverter 21 has the same structure as that of clocked sense inverter 22 except that address A2 and its inverted signal −A2 are input to the gates of transistor 22b and 22c in the opposite manner to the case of clocked sense inverter 22, as shown in FIG. 8.

According to the above mentioned structure, clocked sense inverters 21 and 22 never turn on at the same time. In other words, when clocked sense inverter 21 is at an on-state, clocked sense inverter 21 is at an off-state. On the contrary, when clocked sense inverter 21 is at an off-state, clocked sense inverter 22 is at an off-state. In such a manner, sense inverters 21 and 22 turn on or off alternatively. In order to operate sense inverters 21 and 22 more quickly, their values of logical threshold may be set relatively high so as to quickly detect the change of input data "D", that is, from "1" to "0".

Although the above mentioned embodiments use precharge ROMs, this invention can easily extend to the usage of discharge ROMs. In addition, the selection of column can be carried out in more than two stages.

In summary, the ROM of this invention has a plurality of sub-matrices, each of which is formed by dividing bit lines into a plurality of parts. In each sub-matrix, word lines are used in common. Thus, the number of memory cell transistors contained in each bit line is greatly reduced in this invention. Due to this reduction of transistors, the magnitude of Junction capacitance arising across a bit line and transistors connected to this bit line is also reduced. As a result, the data readout speed of the ROM is greatly improved in this invention as compared with the prior art ROM, without largely increasing the chip area of this device. So, this invention can provide a read only memory having a large capacity without deteriorating the data readout speed.

What is claimed is:

1. A read only memory, comprising:
   a memory cell matrix in which a transistor is placed at each intersecting point of word and bit lines which are arranged in form of a matrix, said transistor being turned on under the control of word line selection signals supplied to said word lines so as to change the voltage of said bit lines;
   a word line decoder for decoding address inputs and generating said word line selection signals;
   a column decoder for generating column control signals according to said address inputs; and
   an output buffer for executing a column selection which is to select a bit line according to said column control signals, and outputting data which correspond to the voltage of said selected bit line;
   wherein said word line decoder includes a signal generating means for generating a column selection signal according to said address inputs;
   said memory cell matrix is comprised of a plurality of sub-matrices, each of which is formed by dividing said bit lines into a plurality of parts, each of said sub-matrix being controlled in common with said word line selection signals; and
   said output buffer includes a column selection circuit having a plurality of stages, the first stage of said column selection circuit selecting a column from each of said sub-matrices according to said column control signals, the second stage or the following of said column selection circuit selecting one column among said selected columns from said sub-matrices according to said column selection signals.

2. The read only memory as claimed in claim 1, wherein the second stage or the following of said column selection circuit is comprised of clocked sense inverters.

3. The read only memory as claimed in claim 1, wherein the number of stages of said column selection circuit corresponds to the number of said sub-matrices.

4. The read only memory as claimed in claim 1, wherein said read only memory is a precharge type of memory.

5. The read only memory as claimed in claim 1, wherein said read only memory is a discharge type of memory.

6. The read only memory as claimed in claim 1, wherein a storage pattern is formed on said memory cell matrix by placing or not placing a transistor on each intersecting point of said word and bit lines.

* * * * *